UNIPOLAR TO BIPOLAR PULSE CONVERTER

Filed Aug. 12, 1964 2 Sheets-Sheet 1

INVENTORS N. E. LENTZ
D. E. MACK
BY [signature]
ATTORNEY

April 30, 1968 N. E. LENTZ ET AL 3,381,088

UNIPOLAR TO BIPOLAR PULSE CONVERTER

Filed Aug. 12, 1964 2 Sheets-Sheet 2

United States Patent Office 3,381,088

Patented Apr. 30, 1968

3,381,088

UNIPOLAR TO BIPOLAR PULSE CONVERTER

Norman E. Lentz, North Andover, Mass., and Donald E. Mack, West Webster, N.Y., assignors to Bell Telephone Laboratories, Incorporated, New York, N.Y., a corporation of New York

Filed Aug. 12, 1964, Ser. No. 389,123

3 Claims. (Cl. 178—70)

This invention relates to pulse generators, and more particularly to pulse generators for alternately generating marks of opposite polarity in response to input marks of the same polarity.

In pulse code modulation systems employing so-called bipolar pulse transmission, which is discussed in U.S. Patent 2,996,578, issued to F. T. Andrews, Jr., on Aug. 15, 1961, each mark is transmitted as a mark whose polarity is opposite that of an immediately preceding mark and each space is transmitted as a space. In order to convert the unipolar pulse train output of the encoders in such a system, which generate marks of the same polarity, into a bipolar pulse train suitable for transmission, the unipolar pulse train is applied in the system disclosed in the above-mentioned patent to a binary counter with the output of the binary counter differentiated to yield a bipolar pulse train. Such an arrangement, however, does not provide a high power output level to the transmission medium, and it is desirable to accomplish this conversion with the resulting power output at a much higher level.

One of the techniques which might be employed to accomplish unipolar to bipolar pulse conversion is disclosed in copending application of N. E. Lentz, Ser. No. 178,781, filed on Mar. 9, 1962, now U.S. Patent 3,172,952, issued Mar. 9, 1965, wherein a pair of blocking oscillators generate marks which are opposite in polarity with respect to one another. The blocking oscillators are connected to a source of unipolar input pulses by means of capacitors which function as memory elements so that input marks are steered to alternate blocking oscillators in succession. As a result, the combined output of the blocking oscillators represents the unipolar pulse input signal in bipolar pulse form. Such an arrangement of blocking oscillators generates the bipolar pulse signal at a much higher power output level than that achieved by the binary counter differentiator arrangement employed by the above-mentioned patent, and does not require the addition of any active elements. The disadvantage of such an arrangement, however, is that the circuitry is not readily adaptable for use with pulse trains having different repetition rates nor is it readily adaptable for pulse trains having different duty cycles since the output transformers of the blocking oscillators cannot be readily adjusted to accommodate such changes.

In an effort to achieve high power output levels while at the same time providing apparatus which is capable of being used with pulse trains having different duty cycles or different pulse repetition rates, multivibrator circuits have been employed in the manner disclosed in copending application of D. L. Favin, Ser. No. 149,043, filed on Oct. 31, 1961, now U.S. Patent 3,188,486, issued June 8, 1965. In that application a pair of multivibrator circuits are employed to generate the bipolar output signals. The collector electrodes of one transistor of each multivibrator are connected together by means of a resistive network to form an output circuit, and the input circuit logic is so arranged that both these transistors conduct in order to produce a bipolar space. Bipolar marks are produced by one or the other of these transistors conducting. Since both transistors whose collector electrodes are connected together must conduct in order to produce a space, the collector electrode voltage swing is limited due to the necessity of providing voltage dropping resistors between the collector electrodes to prevent transistor failure.

A principal object of this invention is to substantially increase the output power of unipolar to bipolar pulse converters employing a pair of multivibrator circuits.

A related object of this invention is to increase the output power of such circuits without any increase in circuit complexity or cost.

In accordance with this invention, a first multivibrator circuit employing transistors of one conductivity type and a second multivibrator circuit employing transistors of a conductivity type opposite that of the first multivibrator circuit are arranged so that the collector electrodes of the transistors of the two bistable circuits that are normally nonconducting are connected together at an output terminal. The source of pulses representing the unipolar input signal to be converted to bipolar form are connected by means of differentiator circuits and diode steering circuitry to the normally conducting transistors of the bistable circuits to render alternate ones of those transistors nonconducting.

This invention will be more fully comprehended from the following detailed description taken in conjunction with the following drawings, in which.

Figure 1:
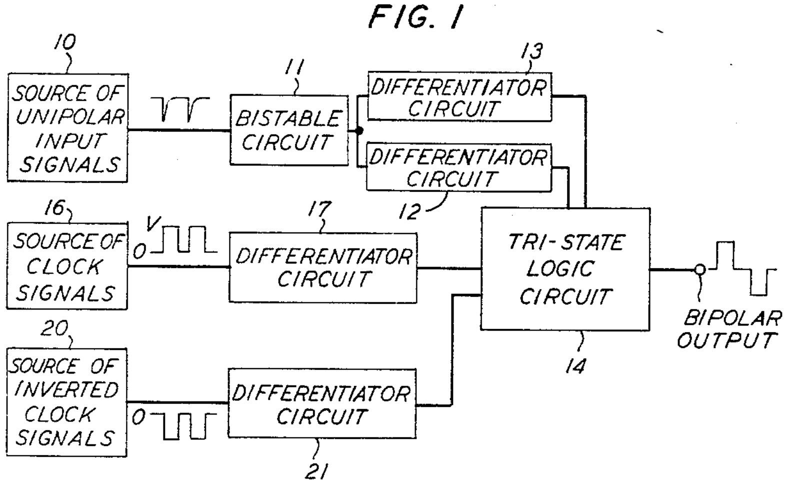
FIG. 1 is a block diagram of a unipolar to bipolar pulse converter embodying this invention.
Figure 3:
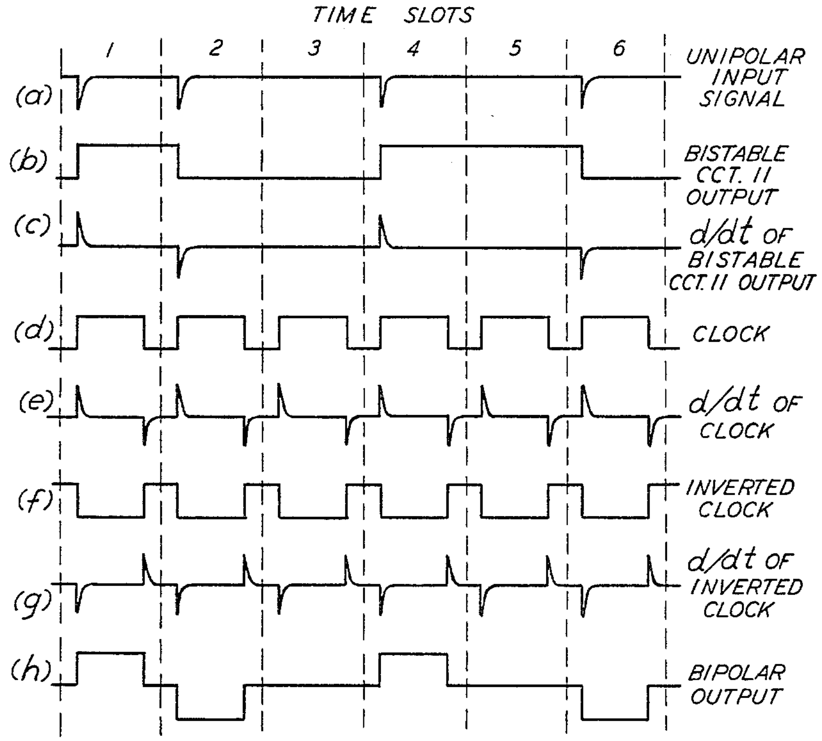
FIG. 3 is a diagram showing a series of signals which are present at various parts of the circuit of FIGS. 1 and 2 and which are useful in understanding the principles of operation of those circuits.

A unipolar to bipolar pulse converter embodying this invention is shown in block diagram form in FIG. 1. Three input signals are applied to the converter. The first, of course, is the unipolar input signal from a source 10, which signal is to be converted to bipolar pulse form. A typical example of such a signal is shown in line *a* of FIG. 3 and is illustrated as having negative going marks. In order for the converter to operate properly, the unipolar input signals must first be applied to a bistable circuit 11 and then differentiated. As is well known in the art, a bistable circuit changes state in response to each incoming pulse input signal so that in response to a first negative unipolar mark shown in line *a* of FIG. 3 a positive going output mark is generated by the bistable circuit 11, and this mark is terminated in response to the second unipolar mark. The output signals from the bistable circuit 11, which signals are shown in line *b* of FIG. 3, are then differentiated by each of a pair of differentiator circuits 12 and 13 each of which generates a positive going mark of short duration in response to the generation of a positive going mark by the bistable circuit 11 and a negative going mark in response to the termination of the positive going mark. Thus, for the typical unipolar pulse input signal shown in line *a* of FIG. 3 positive and negative going marks, or "spikes" as they are commonly called, are generated by the differentiator circuits 12 and 13, and the output of each differentiator circuit is applied to one input of a so-called tri-state logic circuit 14.

Two other input signals required for proper operation are applied to the unipolar to bipolar pulse converter. The first is obtained from a source of clock or timing signals 16 which generates a control signal during each interval of time occupied by a mark or space from source 10. These clock signals are shown in line *d* of FIG. 3 as positive going marks. The signals from source 16 are used in combination with the output signals from differentiator circuits 12 and 13 to govern the generation of negative bipolar output marks by tri-state logic circuit 14, and for this purpose the clock signals are first differentiated by differentiator circuit 17 whose output signal is shown in line *e* of FIG. 4. In addition, a third signal is needed to control the operation of the tri-state logic circuit 14 in generating a positive going output mark. This signal is provided by source 20, which generates negative going clock and timing marks during each interval of time occupied by a mark or space emanating from source 10. The output of source 20 is differentiated by differentiator circuit 21, and the output signal from source 20 is shown in line *g* of FIG. 3.

The tri-state logic circuit 14, to be described below in detail, functions in the following manner. Upon the occurrence of a first unipolar input mark, a positive mark is generated by the tri-state logic circuit 14. This positive mark is terminated by the positive pulse appearing at the output of differentiator circuit 21. Similarly, a second unipolar input mark causes a negative mark to be generated. This negative mark is terminated by the occurrence of a negative mark at the output of differentiator 17. A unipolar input space is represented by a space in the bipolar train. By comparing the unipolar input signals from source 10 shown in line *a* of FIG. 3 with the bipolar output signals shown in line *h*, it is immediately evident that a bipolar output signal is generated corresponding to the unipolar pulse input signal. The first unipolar mark in the first time slot of line *a* of FIG. 3 causes a positive going output mark to be generated by the tri-state logic circuit. This mark is terminated by the positive mark generated by differentiator circuit 21 at the conclusion of the first pulse time interval, and shown in line *g* of FIG. 3. In response to the second unipolar mark a negative going mark is generated by tri-state logic circuit 14, which mark is terminated by the occurrence of the negative mark, shown in line *e* of FIG. 3, generated by differentiator circuit 17 at the conclusion of the second time interval. Thus, the circuitry produces a pattern of output marks which are of alternating polarity.

Figure 2:
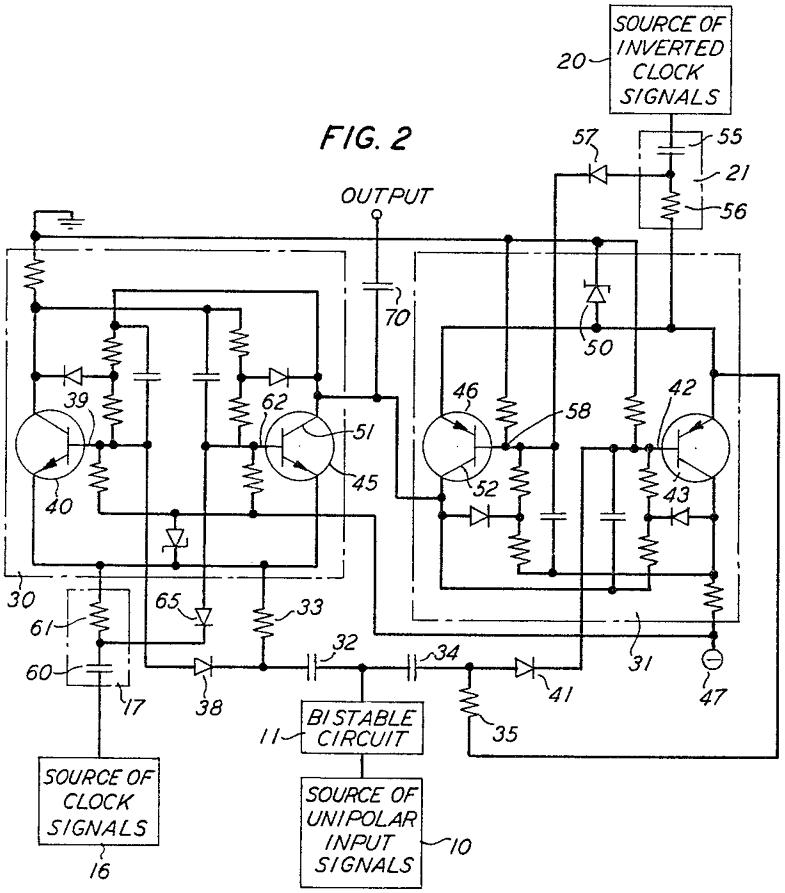
FIG. 2 is a schematic circuit diagram of a unipolar to bipolar pulse converter in which the tri-state logic circuit of FIG. 1 is shown in schematic form.

The tri-state logic circuit is shown in schematic form in FIG. 2. It comprises two multivibrator circuits 30 and 31 coupled together in the manner to be described below. Multivibrator circuit 30 is identical to that shown on page 109, Fig. 11.2(a) of the General Electric Transistor Manual, fifth edition, or Fig. 11.2(A), p. 158, sixth edition, with the sole exception that the bias voltage applied to the base electrodes of each transistor is obtained by means of a Zener diode connected between the source of collector-emitter bias voltage for each transistor and the emitter electrode. Multivibrator 31 is identical to multivibrator 30 in circuit configuration with the exception that the former employs p-n-p type transistors, while the latter employs n-p-n type transistors.

The signals from the source 10 of unipolar pulse input signals are applied, as in FIG. 1, to bistable circuit 11, whose output terminal is connected to a pair of differentiating circuits corresponding to differentiating circuits 12 and 13 in FIG. 1. A first differentiating circuit comprises capacitor 32 and resistor 33 while the second comprises capacitor 34 and resistor 35. The output signal from each of these differentiating circuits is shown in line *c* of FIG. 3, and it is desired to direct negative going marks to one bistable circuit 30 and positive going marks to bistable circuit 31. Toward this end the junction of resistor 33 and capacitor 32 is connected to the cathode of a diode 38 whose anode is connected to the base electrode 39 of transistor 40. As a result only negative going marks are applied to the base electrode 39 of transistor 40. In a similar manner, the junction of capacitor 34 and resistor 35 is connected to the anode of a diode 41 whose cathode is connected to the base electrode 42 of transistor 43 in multivibrator circuit 31. The connection of diode 41 between the differentiator circuit and the base electrode 42 of transistor 43 permits only positive going spikes from the differentiator circuit to reach the base electrode 42 of transistor 43.

For purposes of explanation, assume that transistors 45 and 46 are initially nonconducting while transistors 40 and 43 are conducting. Due to the symmetrical coupling networks in each multivibrator circuit 30 and 31, the collector electrodes of transistors 45 and 46 are at a potential which is halfway between ground and the voltage of negative voltage source 47 which provides the collector-emitter bias. With the application of a first pulse from source 10, the bistable circuit 11 changes state, and a positive going differentiated output spike is generated by the differentiator circuits comprising capacitor 32 and resistor 33 and capacitor 34 and resistor 35. Diode 41 will conduct the positive going spike and steer it toward the base electrode 42 of transistor 43. Transistor 43 is a p-n-p type transistor, so that the positive going voltage spike will turn transistor 43 off, and transistor 46 turns on due to multivibrator action. Since transistor 46 is now on, or conducting, its collector electrode voltage will tend to rise from a point midway between the voltage of negative voltage source 47 and ground toward the emitter voltage, which due to the action of Zener diode 50 is held at a level approximately one-quarter that of the negative voltage of source 47. Because the collector electrode 51 of transistor 45 is directly connected to the collector electrode 52 of transistor 46, the collector electrode of transistor 45 rises to the same voltage as the collector electrode of transistor 46. This rise in voltage at collector electrode 51 of transistor 45 would normally turn transistor 40 on, but no switching action takes place in multivibrator circuit 30 since transistor 40 is already conducting.

Thus, in accordance with this invention, as the result of the generation of a first unipolar mark of negative polarity from source 10, transistor 46 has been turned on and supplies load current to the output terminal of the tri-state logic circuit. This current may be provided through a direct current load isolating capacitor 70 to the output terminal, or if isolation is not required the capacitor may be eliminated. The resulting positive going output mark is shown in the first time slot in line *h* of FIG. 3, and this positive going output mark is generated until its generation is terminated by the action of the inverted clock signals from source 20.

At the conclusion of the first pulse time interval, or time slot, the inverted clock signal generates a positive going mark which is differentiated by the differentiator circuit 21, comprising capacitor 55 and resistor 56. In accordance with this invention, a diode 57 has its anode connected to the junction of capacitor 55 and resistor 56 so that positive going voltage pulses are steered by the diode 57 to the base electrode 58 of transistor 46. This positive going pulse will in accordance with this invention turn transistor 46 off, and transistor 43, as a result of the multivibrator action, is turned on. The voltage at the collector electrodes of transistors 45 and 46 then falls back to the voltage which is midway between ground and the negative voltage of source 47. Transistors 45 and 46 are now nonconductive.

In accordance with this invention, the output of differentiator circuit 17, comprising capacitor 60 and resistor 61, is connected between the base electrode 62 of transistor 45 and the source of clock signals 16 by means of a diode 65. Diode 65 is poled to permit only the passage of negative going voltage spikes between the differentiator circuit 17 and the base electrode 62 so that at the end of the first time interval or time slot a negative going voltage pulse is applied to base electrode 62. This voltage pulse would tend to turn transistor 45 off, but since it is already nonconducting no further switching action takes place. Thus, in accordance with this invention, a first mark from the source of unipolar input pulses 10 causes a positive going bipolar mark, whose width is determined by the inverted clock pulses, to be generated by multivibrator circuit 31 at the collector electrode 51 of transistor 45.

Upon the occurrence of a second mark from source 10, bistable circuit 11 changes state, and in accordance with this invention a negative going mark is applied to the base electrode 39 of transistor 40 through diode 38. Since transistor 40 is an n-p-n type transistor, the negative going mark applied to its base electrode will turn it off, causing transistor 45, as a result of multivibrator action, to conduct. Prior to conducting, the collector electrode of transistor 45 was at a voltage midway between ground potential and the voltage of negative voltage source 47, but upon conducting, its collector electrode potential drops to a voltage midway between its voltage in the nonconducting state and the negative voltage of source 47. Thus, a negative going voltage is developed at the output terminal of the tri-state logic circuit. Since the collector electrodes 51 and 52 of transistors 45 and 46 are connected together, the collector electrode of transistor 46 also drops to the same potential. This action would normally cause transistor 43 to turn on, but since it is already conducting current, no further action takes place. The negative going output mark continues until it is terminated by action of clock signals from source 16 at the end of the second time slot. At the termination of that time slot, a negative going voltage pulse is generated by differentiator circuit 17, and this pulse is steered to the base electrode 62 of transistor 45. Since transistor 45 is an n-p-n transistor, this action turns transistor 45 off, and the tri-state logic circuit is returned to its initial condition with the collector electrodes of transistors 45 and 46 at a potential midway between ground and the negative voltage of source 47.

Thus, in accordance with this invention a first unipolar input mark causes transistor 46 to generate a positive going output mark. In response to a succeeding unipolar input mark, transistor 45 generates a negative going mark. These marks which make up the bipolar pulse train are terminated by the differentiated inverted clock or differentiated clock signals, respectively. In the absence of a unipolar pulse, transistors 45 and 46 are nonconducting, and a space is generated.

In accordance with this invention the signals applied to the tri-state logic circuit are applied in the manner described above so that transistors 45 and 46 never conduct at the same time. Positive going bipolar output pulses are generated by transistor 46, negative going bipolar output pulses are generated by transistor 45, and a space is generated when neither transistor is conducting. Since the input signals are applied in such a manner, the collector electrodes of transistors 45 and 46 may be directly connected together without the necessity of any voltage dropping device between these electrodes. As a result, the output voltage swing of the bipolar output signal is doubled without the addition of any other devices as compared with other converter circuits employing multivibrators. In addition, circuit efficiency is increased by both eliminating the power lost in the usual resistor coupling network and because no current flows in the output transistor when a space is generated.

It is to be understood that the above-described arrangement is only illustrative of the principles of the invention. Numerous other arrangements may be devised by those skilled in the art without departing from the spirit and scope of the invention.

What is claimed is:

1. A unipolar to bipolar pulse converter comprising, a first bistable circuit employing two transistors of one conductivity type, a second bistable circuit employing two transistors of conductivity type opposite that of said first bistable circuit, an output circuit connected to the collecor electrodes of the transistors of said two bistable circuits that are normally nonconducting, a source of unipolar input pulses, the series combination of a bistable circuit connected to receive said unipolar pulses whose output is connected to the input of a differentiator circuit at whose output pulses of alternating polarity are generated in response to the unipolar input pulses, diode circuits for steering said pulses from said output of said differentiator circuit to that normally conducting transistor of the respective one of said bistable circuits that responds to such polarity to render said transistor nonconductive and thus render the other transistor of the respective bistable circuit conductive, a source of pulses of opposite polarity occurring simultaneously at a predetermined time after each pulse from the output of said differentiator circuit, and connections for applying the pulses of proper polarity from said source of pulses of opposite polarity to said other transistors of said bistable circuits to render said other transistors nonconductive.

2. A unipolar to bipolar pulse converter comprising, a first bistable circuit employing two transistors of one conductivity type, a second bistable circuit employing two transistors of conductivity type opposite that of said first bistable circuit, a source of unipolar input pulses, the series combination of a bistable circuit connected to receive said unipolar pulses whose output is connected to a differentiator circuit at whose output pulses of alternate polarity are generated in response to the unipolar input pulses, a source of clock pulses, a source of inverted clock pulses, an output circuit connected to the collector electrodes of the transistors of said two bistable circuits that are normally nonconducting in the absence of a pulse from said differentiator circuit, diode circuits for steering the pulses from the output of said differentiator circuit to that normally conducting transistor of the respective one of said bistable circuits that responds to such polarity to render said transistor nonconductive and thus render the other transistor of the respective bistable circuit conductive, and means to apply pulses of proper polarity from said source of clock signals and said source of inverted clock signals to said other transistors of said bistable circuits to render said other transistors nonconductive.

3. In combination, a first bistable circuit employing two transistors of one conductivity type, a second bistable circuit employing two transistors of conductivity type opposite that of said first bistable circuit, a source of pulses of alternating polarity, a source of clock signals, a source of inverted clock signals, diode circuits for steering positive going pulses from said source of pulses of alternating polarity to a first transistor of a first of said bistable circuits so that said first transistor will be rendered nonconducive by a positive going pulse from said source of pulses of alternating polarity, a diode circuit for steering negative pulses from said source of pulses of alternating polarity to a first transistor of a second bistable circuit so that said first transistor of said second bistable circuit will be rendered nonconductive by a negative going pulse from said source of pulses of alternating polarity, an output circuit connected to the collector electrodes of the second transistors of each of said bistable circuits, said second transistors being normally nonconducting in the absence of a pulse from said source of pulses of alternating polarity, differentiating means to differentiate said clock signals, a diode steering circuit for steering negative going pulses from said source of clock signals to said second transistor of said second bistable circuit to render said second transistor nonconductive, differentiating means connected to said source of inverted clock signals, and a diode steering circuit for steering positive going pulses from said second differentiator circuit to said second transistor of said first bistable circuit to render said second transistor of said first bistable circuit nonconductive.

No references cited.

THOMAS A. ROBINSON, *Primary Examiner.*